United States Patent
Kouno et al.

(10) Patent No.: US 11,512,397 B2
(45) Date of Patent: Nov. 29, 2022

(54) ETCHANT COMPOSITION AND METHOD FOR ETCHING

(71) Applicant: Kanto Kagaku Kabushiki Kaisha, Tokyo (JP)

(72) Inventors: Ryou Kouno, Saitama (JP); Takuo Ohwada, Saitama (JP)

(73) Assignee: KANTO KAGAKU KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/132,560

(22) Filed: Dec. 23, 2020

(65) Prior Publication Data

US 2021/0123142 A1   Apr. 29, 2021

Related U.S. Application Data

(62) Division of application No. 16/316,054, filed as application No. PCT/JP2017/024971 on Jul. 7, 2017, now abandoned.

(51) Int. Cl.
| | | |
|---|---|---|
| C23F 1/26 | (2006.01) | |
| H01L 21/3213 | (2006.01) | |
| H01L 21/308 | (2006.01) | |
| H01L 21/768 | (2006.01) | |

(52) U.S. Cl.
CPC .............. *C23F 1/26* (2013.01); *H01L 21/308* (2013.01); *H01L 21/3213* (2013.01); *H01L 21/32134* (2013.01); *H01L 21/768* (2013.01)

(58) Field of Classification Search
None
See application file for complete search history.

(56) References Cited

U.S. PATENT DOCUMENTS

| | | | |
|---|---|---|---|
| 1,640,737 A | 8/1927 | Taylor | C07B 43/02 |
| | | | 568/939 |
| 4,610,798 A | 9/1986 | Burkus | C23G 1/02 |
| | | | 134/3 |
| 5,424,000 A | 6/1995 | Winicov | C11D 3/40 |
| | | | 134/41 |
| 6,492,271 B1 | 12/2002 | Uozumi et al. | 438/689 |
| 7,189,336 B2 | 3/2007 | Morikawa | C23F 1/18 |
| | | | 216/106 |

(Continued)

FOREIGN PATENT DOCUMENTS

| | | |
|---|---|---|
| JP | 07-122651 | 5/1995 |
| JP | 2001-77118 | 3/2001 |

(Continued)

OTHER PUBLICATIONS

Office Communication dated Mar. 5, 2020 in U.S. Appl. No. 16/316,054, filed Jan. 8, 2019.

(Continued)

*Primary Examiner* — Allan W. Olsen
(74) *Attorney, Agent, or Firm* — Licata & Tyrrell P.C.

(57) ABSTRACT

An etchant composition that is capable of batch etching treatment of a tungsten film and a titanium nitride film and a method for etching using said etchant composition are provided. The etching composition of the present invention is an etchant composition comprising nitric acid and water for batch etching treatment of a tungsten film and a titanium nitride film.

8 Claims, 2 Drawing Sheets

(56) References Cited

U.S. PATENT DOCUMENTS

| | | | |
|---|---|---|---|
| 2003/0207513 A1 | 11/2003 | Saitou | C23F 1/20 438/200 |
| 2005/0156140 A1 | 7/2005 | Shimizu et al. | 252/79.3 |
| 2006/0189123 A1 | 8/2006 | Saitou | C23F 1/20 438/622 |
| 2012/0028871 A1* | 2/2012 | Westwood | G03F 7/423 510/176 |
| 2013/0178069 A1 | 7/2013 | Shimada | H01L 21/32134 438/753 |
| 2013/0203263 A1 | 8/2013 | Shimada | H01L 21/30604 438/753 |
| 2014/0030425 A1 | 1/2014 | Owei | H05K 3/383 427/97.1 |
| 2015/0075850 A1 | 3/2015 | Ohwada | H05K 3/067 174/257 |
| 2015/0200112 A1 | 7/2015 | Han et al. | H01L 21/32133 |
| 2015/0255494 A1 | 9/2015 | Hogan | H01L 27/1222 438/585 |
| 2016/0053386 A1 | 2/2016 | Mizutani | H01L 21/32134 438/669 |
| 2016/0257880 A1 | 9/2016 | Hong et al. | C09K 13/00 |
| 2017/0167033 A1 | 6/2017 | Sengoku | C23F 1/28 |
| 2017/0355881 A1 | 12/2017 | Tamai | B24B 37/00 |
| 2017/0355882 A1 | 12/2017 | Otsuki | B24B 37/00 |

FOREIGN PATENT DOCUMENTS

| | | |
|---|---|---|
| JP | 2004-031791 | 1/2004 |
| JP | 2005-166924 | 6/2005 |
| JP | 2010-010273 | 1/2010 |
| JP | 2013-033942 | 2/2013 |
| JP | 2015-030809 | 2/2015 |
| KR | 20130049504 A2 * | 5/2013 |
| KR | 10-2015-0050278 | 5/2015 |
| KR | 10-1587758 | 1/2016 |

OTHER PUBLICATIONS

Office Communication dated Aug. 20, 2020 in U.S. Appl. No. 16/316,054, filed Jan. 8, 2019.

* cited by examiner (a) Tungsten film (b) Titanium nitride film

ETCHANT COMPOSITION AND METHOD FOR ETCHING

This patent application is a divisional of U.S. patent application Ser. No. 16/316,054 filed Jan. 8, 2019 which is the U.S. National Stage Application of International Application No. PCT/JP2017/024971, filed Jul. 7, 2017, which claims the benefit of priority from Japanese Patent Application No. 2016-136336, filed Jul. 8, 2016, teachings of each of which are herein incorporated by reference in their entirety.

TECHNICAL FIELD

The present invention relates to an etchant composition for batch etching treatment of tungsten film and titanium nitride film, and a method for etching using said etchant composition.

BACKGROUND ART

Tungsten and titanium nitride are both widely used for electric devices such as a semiconductor element. They are deposited as a film having film properties that are appropriate for a desired electric device, processed into a predetermined pattern, and used. As a method for processing tungsten film or titanium nitride film in a predetermined pattern, processing by etching has widely been adopted.

As an electric device using tungsten and titanium nitride, a semiconductor memory such as a nonvolatile memory has been known. Recently, such electric devices has remarkably advanced in high-speed processing and capacity enlargement, which in turn has resulted in a greater refinement and complication of the intended pattern shape. Consequently, there also is a growing requirement for techniques and etchants which is used for processing of a pattern.

Particularly, when capacity enlargement of a memory is proceeded by adopting a three-dimensional structure, such as the recently published 3D NAND technique, an etchant that is capable of an accurate manufacture of desired three-dimensional structure is required.

Patent References 1 and 2 disclose methods of processing a tungsten film using an etchant comprising hydrogen peroxide or ortho periodic acid.

Patent References 3 and 4 disclose methods of processing a titanium nitride film using an etchant comprising hydrogen peroxide.

However, in the above references, no investigation has been made for an etchant composition for batch etching treatment of a tungsten film and a titanium nitride film. Moreover, when a complicated shape such as a three-dimensional structure is to be formed by a batch etching treatment of a tungsten film and a titanium nitride film, it is necessary to control the etching rate of both of the tungsten film and the titanium nitride film. However, no investigation has been made for such controlling.

PRIOR ART REFERENCES

Patent References

[Patent Reference 1] JP A 2004-31791
[Patent Reference 2] JP A 2005-166924
[Patent Reference 3] JP A 2010-10273
[Patent Reference 4] JP A 2015-30809

SUMMARY OF THE INVENTION

Problems to be Solved by the Invention

In view of the conventional problems, an object of the present invention is to provide an etchant composition that is capable of batch etching treatment of tungsten film and titanium nitride film and a method for etching using said etchant composition. Furthermore, another object of the present invention is to provide the etchant composition that is capable of batch etching treatment of tungsten film and titanium nitride film and the method for etching using said etchant composition, while controlling the value of the quotient obtained by dividing the etching rate for the tungsten film by the etching rate for the titanium nitride film (hereinbelow, also referred to as "selection ratio").

Means to Solve the Problems

In the course of our investigation to address the above objects, we faced problems including that conventional etchant compositions could not accurately form the desired pattern shape because their etching rate is very fast and the selection ratio is greatly departing from 1. We made a diligent investigation in order to solve such problems and found that an etchant composition comprising nitric acid and water is capable of batch etching of a tungsten film and a titanium nitride film in a favorable shape with good accuracy. We proceeded further study and finally completed the invention.

Namely, the present invention relates to the followings:
[1] Etchant composition for batch etching treatment of tungsten film and titanium nitride film comprising nitric acid and water.
[2] The etchant composition according to [1] further comprising at least one selected from the group consisting of sulfuric acid and aliphatic sulfonic acid.
[3] The etchant composition according to [2], wherein the aliphatic sulfonic acid is methanesulfonic acid.
[4] The etchant composition according to any one of [1] to [3] further comprising phosphoric acid.
[5] Method for batch etching of tungsten film and titanium nitride film using the etchant composition according to any one of [1] to [4].
[6] The method according to [5], wherein the temperature of the etching composition at which the etching is performed is 50° C. or higher.
[7] The method according to [5] or [6] for generating a pattern having a three-dimensional structure.

Effects of the Invention

According to the present invention, an etchant composition that is capable of batch etching treatment of tungsten film and titanium nitride film and a method for etching using said etchant composition can be provided.

Specifically, by including at least one selected from the group consisting of sulfuric acid and aliphatic sulfonic acid in the etchant composition of the present invention, it becomes possible to control the selection ratio at approximately 1, which makes the aforementioned effect remarkable.

MODES FOR PRACTICING THE INVENTION

Figure 1:
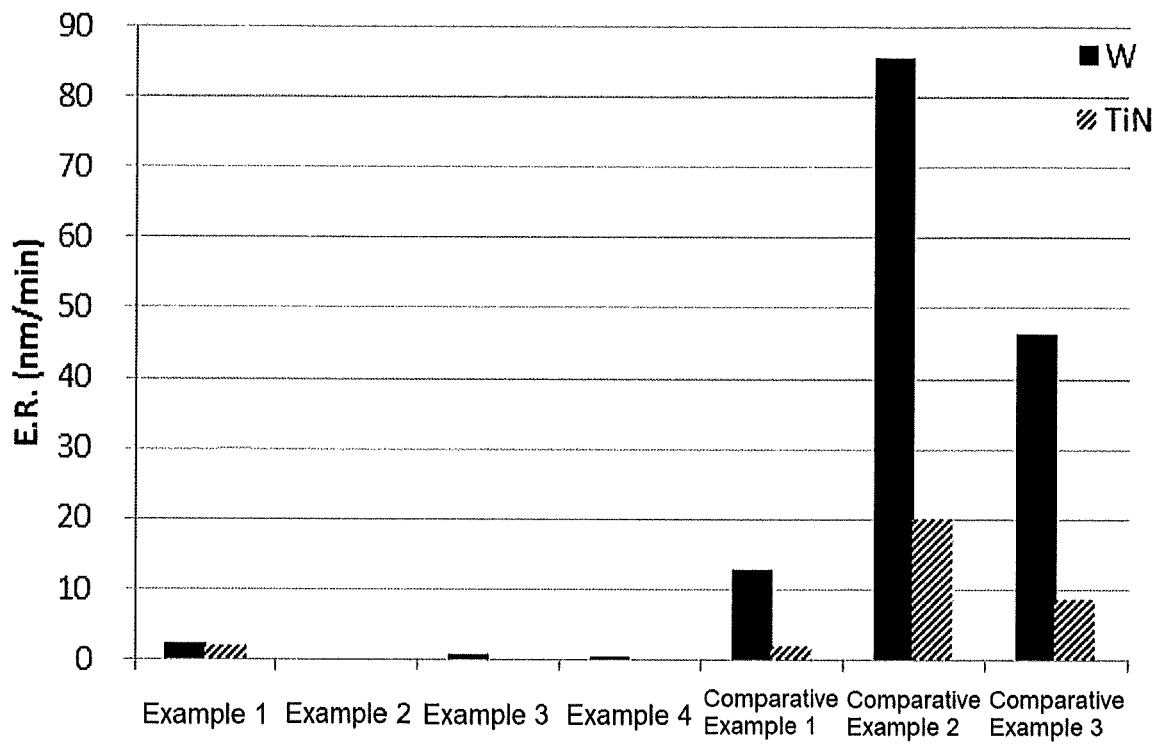
FIG. 1 is a graph showing the etching rate of the etchant composition (E.R.) of Working Examples 1 to 4 and Comparative Examples 1 to 3.

Hereinbelow, the present invention is illustrated in detail based on suitable embodiments of the present invention.

The etchant composition of the present invention is used for batch etching treatment of tungsten film and titanium nitride film.

The etchant composition of the present invention comprises nitric acid and water. This enables a reduction in etching rates for tungsten film and titanium nitride film to appropriate level, which in turn enables providing an etchant composition for batch etching treatment of tungsten film and titanium nitride film which has never been investigated so far.

In the etchant composition of the present invention, water is used as a solvent.

The content of water in the etchant composition is, though not being particularly limited, preferably between 2.0 and 80.0 wt %, more preferably between 5.0 and 70.0 wt %.

Specifically, when etching treatment is carried out under a temperature-rising condition, the content of water is made to be preferably between 8.0 and 65.0 wt % in order to suppress a change in the constitution of the etchant composition due to water evaporation. It is preferred to suppress the change in the constitution of the etchant composition because it reduces a risk of a change in the selection ratio during etching treatment due to constitution change even when the etching treatment under the temperature-rising condition requires a prolonged time. Moreover, it enables a repeated use of the etchant composition because the change in the selection ratio before and after the etching treatment is small. This is preferred from the perspective of reduction of the cost and environmental burden resulting from waste liquid processing of the etchant.

The etchant composition of the present invention preferably comprises at least one selected from the group consisting of sulfuric acid and aliphatic sulfonic acid.

When the etchant composition consists of nitric acid and water, it is difficult to decrease the water content in the etchant composition. However, the water content can further be decreased by adding at least one selected from the group consisting of sulfuric acid and aliphatic sulfonic acid.

This is preferred because it enables controlling of the constitution of the etchant composition in a wider range, and because it enables decreasing the water content in a case where it is desired to suppress a change in the constitution of the etchant composition due to water evaporation.

As mentioned later, the content of a constituent of the etchant composition of the present invention is not particularly limited because it is adjusted as appropriate by the intended selection ratio and the film properties of the tungsten film and the titanium nitride film, though the content of at least one selected from the group consisting of sulfuric acid and aliphatic sulfonic acid is preferably between 5.0 and 95.0 wt %, more preferably between 8.0 and 40.0 wt %.

Examples for the aliphatic sulfonic acid include an aliphatic sulfonic acid having 1 to 10 carbon atoms. More specific examples include such as methanesulfonic acid, ethanesulfonic acid and 1-propanesulfonic acid. As an aliphatic sulfonic acid used in the etchant composition of the present invention, methanesulfonic acid is preferred.

The etchant composition of the present invention preferably comprises phosphoric acid. It is preferred to include phosphoric acid in the etchant composition, because it enables adjusting of the constitution of the etchant composition in wider range.

As mentioned later, the content of a constituent of the etchant composition of the present invention is not particularly limited because it is adjusted as appropriate by the intended selection ratio and the film properties of the tungsten film and the titanium nitride film, though the content of phosphoric acid is preferably between 0.1 and 90.0 wt %, more preferably between 0.5 and 80.0 wt %.

The etchant composition of the present invention may comprise any ingredient in addition to the above-mentioned ingredients, as long as it does not hinder the batch etching treatment of tungsten film and titanium nitride film. Optional ingredients which may be used in the present invention include such as, for example, a surfactant.

Nevertheless, in a case where the formation of an accurate pattern such as a pattern having a three-dimensional structure is required, it is preferred not to include hydrogen peroxide and ortho periodic acid, as well as a fluorine-containing compound such as hydrofluoric acid which would cause an undue increase in etching rate.

Moreover, when it is required to suppress the change in constitution of the etchant composition under a temperature-rising condition, it is preferred not to include a highly volatile ingredient even if the ingredient is generally contained in an etchant. Specific examples for such highly volatile ingredient include carboxylic acids such as a formic acid and acetic acid and the salts thereof, as well as polyfunctional carboxylic acids such as citric acid and tartaric acid and the salts thereof.

As mentioned above, the etchant composition of the present invention is used for batch etching treatment of tungsten film and titanium nitride film. In another embodiment, the etchant composition of the present invention is used for forming a pattern having a three-dimensional structure by batch etching treatment of tungsten film and titanium nitride film.

Namely, the etchant composition of the present invention may be used for batch etching of a laminate body comprising at least one layer of tungsten film and at least one layer of titanium nitride film. Furthermore, controlling of the selection ratio to approximately 1 enables batch etching of tungsten film and titanium nitride film in a refined shape, for examples, in a pattern having a three-dimensional structure. In order to form a refined structure, the selection ratio is preferably between 0.70 and 1.30, more preferably between 0.80 and 1.20.

The selection ratio of the etchant composition of the present invention may be adjusted as appropriate by altering the constituents of the composition. For instance, the selection ratio tends to be decreased a little by increasing the content of nitric acid in the etchant composition, whereas the selection ratio tends to be increased by increasing water content. On the other hand, the selection ratio tends to be decreased by increasing the content of either of sulfuric acid, aliphatic sulfonic acid or phosphoric acid. Because the selection ratio also depends on the film properties of the tungsten film and the titanium nitride film, the desired selection ratio can be obtained by adjusting the constituents of the composition as appropriate according to the film properties of the film to be subjected to the etching.

As mentioned above, the content of a constituent of the etchant composition of the present invention is not particularly limited because it is adjusted as appropriate by the intended selection ratio and the film properties of the tungsten film and the titanium nitride film, though the content of nitric acid is preferably between 0.01 and 10.0 wt %, further preferably between 0.1 and 5.0 wt %.

The etching rate (nm/min) of the etchant composition in the present specification is defined as the etching amount (nm) of a film per treatment time (min). The etching amount of a film can be calculated as the difference between the thickness of the film to be subjected to the etching measured before and after the etching treatment.

The etching rate of the etchant composition of the present invention is not particularly limited, though it is preferably in a range between 0.1 and 20.0 nm/min, more preferably in a range between 0.1 and 4.0 nm/min, and further preferably in a range between 0.1 and 2.0 nm/min, for each of the tungsten film and the titanium nitride film. An etchant composition having an appropriately low etching rate as described above is suitable for the etching for manufacture of an accurate structure such as a pattern having a three-dimensional structure.

The etching rate for the tungsten film and the etching rate for the titanium nitride film may be modulated corresponding to the thickness or film properties of the tungsten film and the titanium nitride film. For instance, they may be modulated by adjusting as appropriate at least one of the constitution of the etchant composition of the present invention and the temperature at which the etching is carried out.

The tungsten film and the titanium nitride film to be subjected to batch etching by the etchant composition of the present invention may be in a form of a substrate comprising the tungsten film and the titanium nitride film each being deposited as a film onto a base material.

Constituents for such base material include such as silicon, glass, quartz, polyethylene terephthalate, and polyether sulfone. Moreover, the tungsten film and the titanium nitride film may be formed onto a silicon oxide film ($SiO_2$) which has been formed onto said base material.

Moreover, the present invention, in one embodiment, relates to a method for batch etching of tungsten film and titanium nitride film using the aforementioned etchant composition.

The method for etching of the present invention is preferably performed to a substrate comprising a tungsten film and a titanium nitride film. Such substrates comprising a tungsten film and a titanium nitride film include, though being not particularly limited, for example, an embodiment in which at least one layer of titanium nitride film and at least one layer of tungsten film have been laminated onto the aforementioned base material. Preferably, it is a substrate in which a titanium nitride film and a tungsten film have been laminated in this order onto a base material.

Etching can be performed by bringing the aforementioned etchant composition into contact with the tungsten film and the titanium nitride film of said substrate by a known method, for example.

The temperature of the etching composition at which etching is performed is, though not particularly limited, preferably 50° C. or higher.

On the other hand, when the temperature of the etchant composition at which etching is performed is below 50° C., a practical etching rate may not be obtained.

In one embodiment of the present invention, the etchant composition and method for etching of the present invention relate to an etchant composition and method for etching an electrode in manufacture of various electronic devices, specifically a semiconductor memory such as a nonvolatile memory including an NAND-type flash memory. In one further embodiment of the present invention, the etchant composition and method for etching of the present invention relate to an etchant composition and method for etching for generating a pattern having a three-dimensional structure, by which it becomes possible to obtain an advanced device such as a large capacity memory.

The present invention have been illustrated in detail based on its suitable embodiments as above, though the present invention is not limited thereto and each constitution may be substituted with any substituent which is capable of exhibiting a similar function, or any constituent may also be added.

WORKING EXAMPLES

The present invention will be presented with the following Working Examples and Comparative Examples to further illustrate the content of the invention, though the present invention is not limited to these Working Examples.

Experiments were carried out using the etchant compositions of the present invention and the etchant composition for comparison according to the following methods.

A silicon substrate on which a tungsten film is deposited with 98.8 nm film thickness, and another silicon substrate on which a titanium nitride film is deposited with 81.2 nm film thickness were prepared separately. Each etchant composition was kept at the temperature described in Tables 1 and 2, and each of the prepared substrates was subjected to etching treatment for 30 or 60 min under no-stirring and immersion condition. The etched substrates were washed with ultrapure water and dried by nitrogen blowing.

For each of the tungsten film and the titanium nitride film before and after the etching treatment, the film thickness was measured using fluorescent X-ray device (Rigaku Corporation, ZSX100e). Then, for each of the tungsten film and the titanium nitride film, the etching amount was calculated from the difference in the film thickness between before and after the etching treatment.

Tables 1 and 2 show the constitution of the etchant compositions used in each of the Working Examples and the Comparative Examples, as well as the results of the etching of the tungsten film and the titanium nitride film. The etching rates (E.R.) for the tungsten film and the titanium nitride film are each calculated from the inclination of the straight line of the linear function derived from the relationship between the etching amount (nm) and the treatment time (min) for the tungsten film and the titanium nitride film. The selection ratio (W/TiN) was calculated by dividing the etching rate for the tungsten film by the etching rate for the titanium nitride film.

TABLE 1

| | H$_3$PO$_4$ (wt %) | HNO$_3$ (wt %) | H$_2$SO$_4$ (wt %) | MeSO$_3$H (wt %) | H$_2$O (wt %) | Temperature (° C.) | E.R. of W (nm/min) | E.R. of TiN (nm/min) | Selection Ratio (W/TiN) |
|---|---|---|---|---|---|---|---|---|---|
| Working Example 1 | 0 | 1.21 | 36.50 | 0 | 62.29 | 70 | 2.17 | 2.09 | 1.04 |
| Working Example 2 | 0 | 1.21 | 0 | 30.00 | 68.79 | | 0.31 | 0.26 | 1.18 |
| Working Example 3 | 71.38 | 1.21 | 11.73 | 0 | 15.68 | | 0.63 | 0.64 | 0.99 |
| Working Example 4 | 68.44 | 1.16 | 0 | 17.71 | 12.69 | | 0.44 | 0.43 | 1.02 |

TABLE 2

| | H$_2$O$_2$ (wt %) | KOH (wt %) | TMAH (wt %) | EDTA (wt %) | H$_2$O (wt %) | Temperature (° C.) | E.R. of W (nm/min) | E.R. of TiN (nm/min) | Selection Ratio (W/TiN) |
|---|---|---|---|---|---|---|---|---|---|
| Comparative Example 1 | 31.00 | 0.05 | 0 | 0 | 68.95 | 28 | 12.78 | 2.05 | 6.23 |
| Comparative Example 2 | 28.40 | 0 | 0.50 | 0 | 71.10 | 60 | 85.68 | 20.32 | 4.22 |
| Comparative Example 3 | 14.20 | 0 | 1.80 | 1.40 | 82.60 | 60 | 46.24 | 8.68 | 5.33 |

The etchant composition of Comparative Example 1 is the etchant composition described in JP A 2004-031791. The etchant compositions of Comparative Examples 2 and 3 are the etchant compositions descried in JP A 2010-010273.

The etchant compositions of Comparative Examples 1 to 3 cannot be used for etching for generating an accurate structure because the etching rate for at least one of the tungsten film and the titanium nitride film reaches a large value exceeding 10 nm/min (Table 2, FIG. 1). Furthermore, because the selection ratio is greatly apart from 1, it is difficult to perform batch etching of tungsten film and titanium nitride film in a well-controlled manner (Table 2, FIG. 2).

Figure 2:
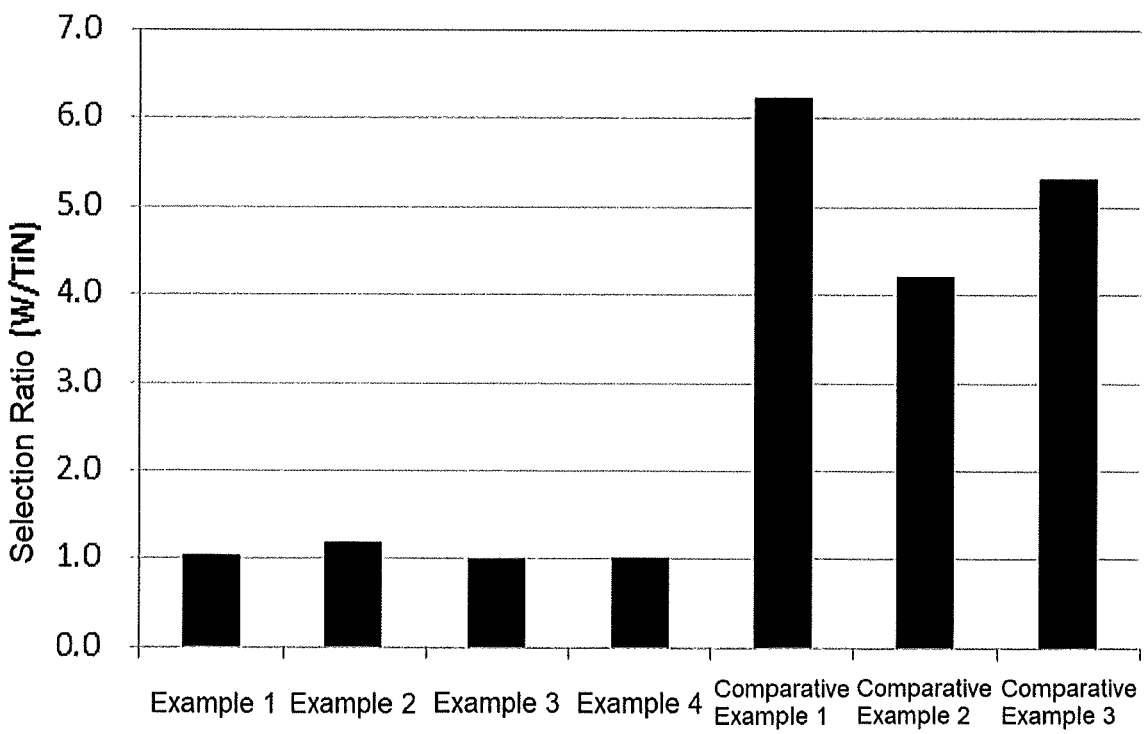
FIG. 2 is a graph showing the selection ratio of the etchant composition of Working Examples 1 to 4 and Comparative Examples 1 to 3.

In contrast to these Comparative Examples, the etchant compositions of Working Examples 1 to 4 had appropriately low etching rate for tungsten film and titanium nitride film (Table 1, FIG. 1), and, at the same time, had selection ratio of approximately 1 (Table 1, FIG. 2). Therefore, the etchant compositions of Working Examples 1 to 4 are capable of a well-controlled batch etching of tungsten film and titanium nitride film, and furthermore are suitable for etching for generating an accurate structure such as a pattern having a three-dimensional structure.

Figure 3:
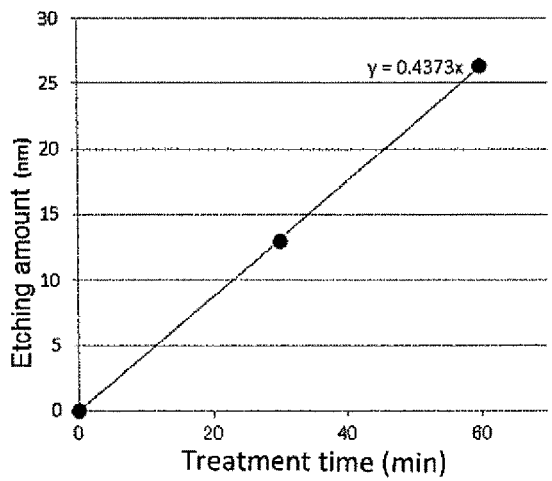
FIG. 3 is a graph showing the change in the etching amount of the etchant composition of Working Example 4 over time.
Figure 3:
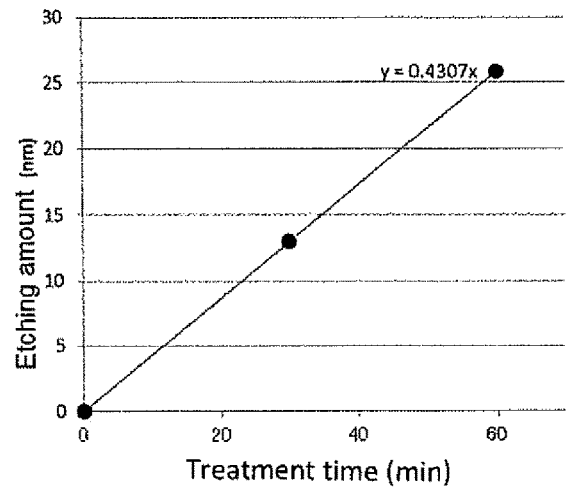

Furthermore, FIG. 3 is a graph in which the etching amount by the etchant composition of Working Example 4 is plotted against the treatment time for each of the tungsten film (a) and the titanium nitride film (b).

The graph of FIG. 3 indicates that the etching amount by the etchant composition of Working Example 4 linearly increases against treatment time for both the tungsten film and the titanium nitride film. This means that the etching rate (which corresponds to the inclination of the straight line connecting between plotted points) has caused almost no change with time. Moreover, because the selection ratio of the etching composition of Working Example 4 is approximately 1 (Table 1, FIG. 2) and there is little change in etching rate with time (FIG. 3), it is obvious that the selection ratio of the etching composition of Working Example 4 is kept at approximately 1 without changing with time.

INDUSTRIAL APPLICABILITY

The use of the etchant composition of the present invention enables batch etching treatment of a tungsten film and a titanium nitride film.

What is claimed is:

1. A method for batch etching tungsten film and titanium nitride film, said method comprising treating the tungsten film and titanium nitride film via batch etching with an etchant composition comprising nitric acid, water and more than 11 up to 40.0 wt % of aliphatic sulfonic acid.

2. The method of claim 1, wherein the etchant composition comprises methanesulfonic acid.

3. The method of claim 1, wherein the temperature of the etchant composition at which the etching is performed is 50° C. or higher.

4. The method of claim 1 further comprising forming a pattern having a three-dimensional structure.

5. The method of claim 1, wherein the content of water is between 2.0 and 80.0 wt %.

6. The method of claim 1 wherein the etchant composition further comprises phosphoric acid.

7. The method of claim 1, wherein the content of aliphatic sulfonic acid is between 11.73 and 40.0 wt %.

8. The method of claim 1, wherein the content of water is between 5.0 and 70.0 wt %.

* * * * *